(12) United States Patent
Kolics

(10) Patent No.: US 8,921,296 B2
(45) Date of Patent: Dec. 30, 2014

(54) POST DEPOSITION WAFER CLEANING FORMULATION

(75) Inventor: Artur Kolics, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 468 days.

(21) Appl. No.: 12/965,777

(22) Filed: Dec. 10, 2010

(65) Prior Publication Data
US 2011/0152151 A1 Jun. 23, 2011

Related U.S. Application Data

(60) Provisional application No. 61/289,982, filed on Dec. 23, 2009.

(51) Int. Cl.
| | | |
|---|---|---|
| C11D 1/88 | (2006.01) |
| C11D 3/00 | (2006.01) |
| C11D 3/04 | (2006.01) |
| C11D 3/06 | (2006.01) |
| C11D 3/24 | (2006.01) |
| C11D 3/34 | (2006.01) |
| C11D 3/36 | (2006.01) |
| C11D 11/00 | (2006.01) |
| C11D 3/20 | (2006.01) |

(52) U.S. Cl.
CPC ............ C11D 3/0073 (2013.01); *C11D 3/2086* (2013.01); C11D 3/042 (2013.01); C11D 3/06 (2013.01); C11D 3/2075 (2013.01); C11D 3/2082 (2013.01); C11D 3/245 (2013.01); C11D 3/3409 (2013.01); C11D 3/361 (2013.01); C11D 3/362 (2013.01); C11D 11/0047 (2013.01)
USPC ............ 510/175; 510/176; 134/1.3; 252/79.1

(58) Field of Classification Search
CPC ..................... C11D 11/0047; H01L 21/02063
USPC ................................. 510/175, 176; 252/79.1
See application file for complete search history.

(56) References Cited

U.S. PATENT DOCUMENTS

| | | | |
|---|---|---|---|
| 7,410,820 B2 | 8/2008 | Jacobs et al. | |
| 7,465,408 B1 * | 12/2008 | Avanzino | 216/100 |
| 7,718,590 B2 * | 5/2010 | Suzuki et al. | 510/175 |
| 7,928,046 B2 * | 4/2011 | Ilardi et al. | 510/175 |
| 2002/0039984 A1 * | 4/2002 | Ketelson et al. | 510/247 |
| 2004/0242451 A1 * | 12/2004 | Ketelson et al. | 510/510 |
| 2005/0124519 A1 * | 6/2005 | Sherry et al. | 510/238 |
| 2006/0024967 A1 | 2/2006 | Thesauro et al. | |
| 2006/0068589 A1 | 3/2006 | Bian | |
| 2006/0154839 A1 * | 7/2006 | Ilardi et al. | 510/175 |
| 2006/0199749 A1 * | 9/2006 | Suzuki et al. | 510/175 |
| 2006/0281196 A1 | 12/2006 | Feeney et al. | |
| 2007/0066503 A1 * | 3/2007 | Basaly | 510/238 |
| 2007/0287277 A1 | 12/2007 | Kolics et al. | |

(Continued)

*Primary Examiner* — Gregory Webb
(74) *Attorney, Agent, or Firm* — Martine Penilla Group, LLP

(57) ABSTRACT

Methods and systems for cleaning corrosion product of a metallic capping layer from the surface of a substrate are provided. According to one embodiment, a treatment solution includes a surfactant, a complexing agent, and a pH adjuster. The surfactant is configured to enhance wetting of the substrate surface, and inhibit further corrosion of the capping layer. The complexing agent is configured to bind to metal ions which have desorbed from the substrate surface. The pH adjuster is configured to adjust the pH to a desired level, so as to promote desorption of the corrosion product from the substrate surface.

12 Claims, 6 Drawing Sheets

(56) References Cited

U.S. PATENT DOCUMENTS

| | | |
|---|---|---|
| 2008/0236619 A1 | 10/2008 | Chen et al. |
| 2008/0265416 A1 | 10/2008 | Lee et al. |
| 2009/0065735 A1* | 3/2009 | Kolics et al. ............... 252/79.1 |
| 2009/0072190 A1 | 3/2009 | Kolics |
| 2009/0090635 A1* | 4/2009 | Basaly ..................... 205/213 |
| 2009/0107520 A1* | 4/2009 | Lee et al. ................... 134/2 |
| 2009/0130849 A1* | 5/2009 | Lee ........................... 438/693 |
| 2009/0133716 A1* | 5/2009 | Lee ........................... 134/3 |
| 2009/0137191 A1* | 5/2009 | Lee ........................... 451/36 |
| 2009/0246359 A1* | 10/2009 | Kolics et al. ............... 427/98.6 |
| 2010/0043823 A1* | 2/2010 | Lee ........................... 134/1.3 |
| 2010/0105595 A1* | 4/2010 | Lee ........................... 510/176 |

\* cited by examiner

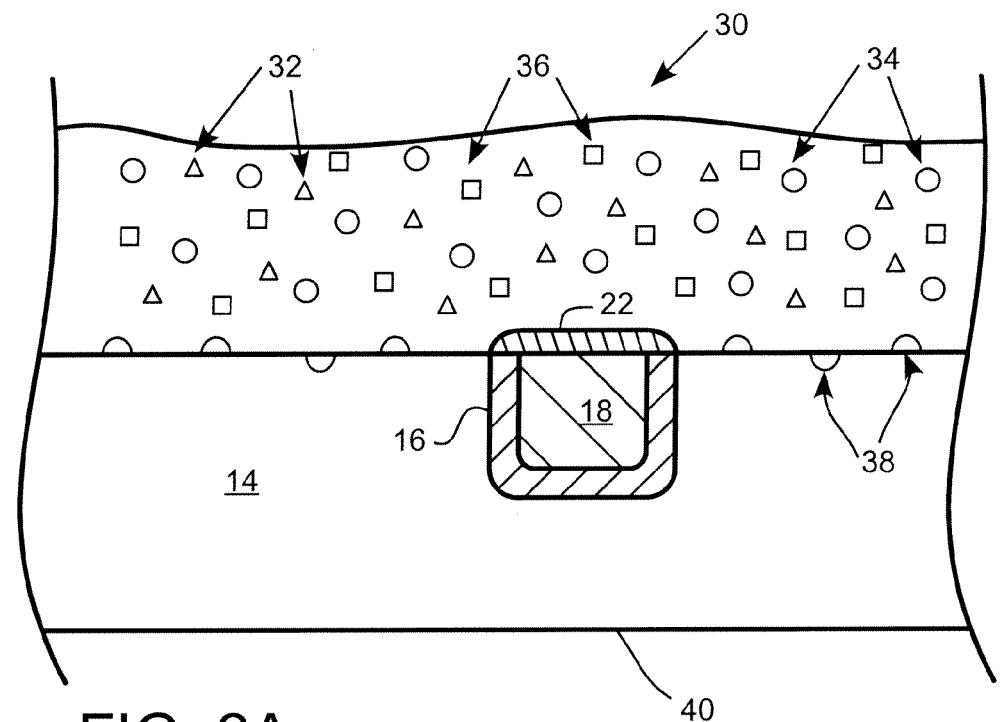
FIG. 2A
○ Complexing Agent
□ pH Adjuster
△ Surfactant
⌒ Corrosion Product
FIG. 2B
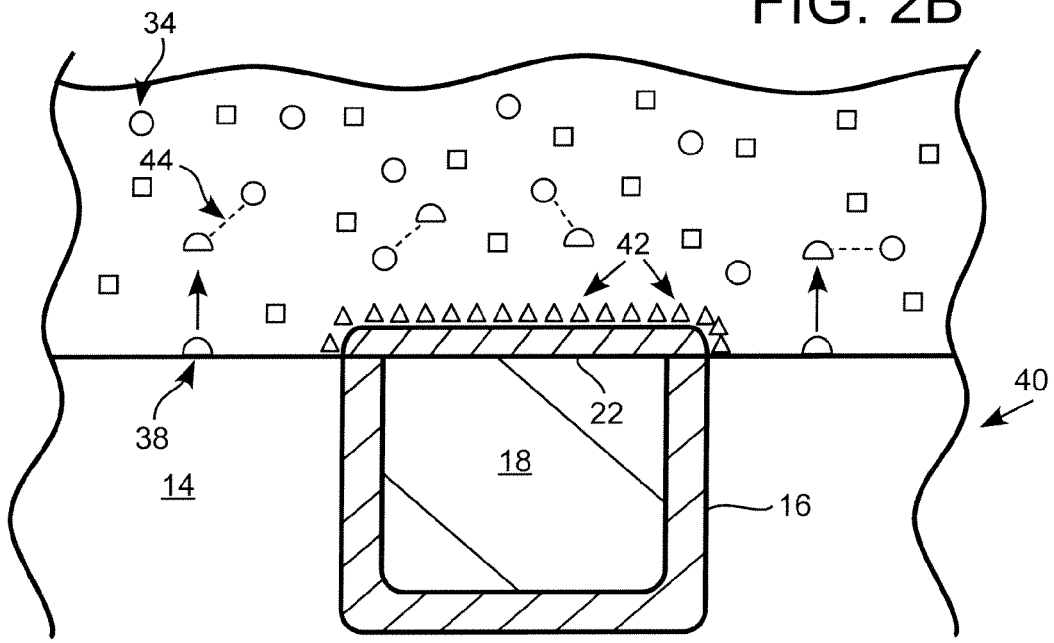

POST DEPOSITION WAFER CLEANING FORMULATION

PRIORITY CLAIM

This application claims priority from U.S. Provisional Patent Application No. 61/289,982 filed on Dec. 23, 2009 and entitled "Post Deposition Wafer Cleaning Formulation," which is incorporated herein by reference in its entirety for all purposes.

BACKGROUND

1. Field of the Invention

The present invention relates to semiconductor fabrication. More specifically, the present invention relates to formulations and methods for cleaning a substrate surface, and more specifically, for removal of corrosion products from a substrate surface.

2. Description of the Related Art

Semiconductor devices are used in products such as cell phones, radios, televisions, etc. The semiconductor devices include integrated circuits that are connected by conductive wires embedded in insulating material. With the reduction of semiconductor device size and the use of low dielectric constant (low k) interlayer dielectric (ILD) insulating materials, obtaining reliable semiconductor devices is becoming more and more challenging. In particular, reliability problems occur at interfaces of the copper (Cu) wires and low k ILD material in the form of leakage, electromigration, stress migration, break down voltage, and time dependent dielectric breakdown (TDDB), etc.

The dielectric layers are subject to surface contamination during the manufacturing process (e.g., Cu chemical mechanical polishing (CMP) or electroless plating of a metallic capping layer, such as cobalt tungsten phosphorous (CoWP)). These contaminants are charged and mobile, especially under stress, such as high temperature and electric field. The mobility of these contaminants can cause high leakage currents, and may cause damage to the dielectric materials when they move along the interface.

Electroless plated caps can be used in electronic devices to improve the electromigration and stress-migration properties of metallization structures. Electroless deposition processes are wet chemical processes. Such processes are often used with wet cleaning processes to clean the substrates. Although liquid solutions are known for numerous cleaning applications, the present inventors have recognized a need for new and/or improved cleaning solution formulations and methods suitable to clean substrates for the manufacture of electronic devices.

It is in this context that embodiments of the invention arise.

SUMMARY

This invention pertains to fabrication of electronic devices. More specifically, the invention pertains to treatment solutions for removing corrosion product from substrate surfaces.

In one embodiment, a treatment solution is configured for application onto a wafer surface which includes a metallic capping layer. The treatment solution is effective for rinsing corrosion product of the metallic capping layer from the wafer surface while reducing corrosion of the metallic capping layer.

In one embodiment, the solution includes a surfactant. The surfactant is configured to enhance wetting of the wafer surface and to inhibit further corrosion of the capping layer. Additionally, the solution is maintained at a pH of approximately less than 3 during the application onto the wafer surface.

In one embodiment, the surfactant is configured to form a self-assembled monolayer on the metallic capping layer.

In one embodiment, the surfactant is an amphoteric surfactant.

In one embodiment, the concentration of the surfactant in the solution is approximately in the range of 10 ppm to 2000 ppm. In another embodiment, the concentration of the surfactant in the solution is approximately in the range of 300 ppm to 700 ppm.

In one embodiment, the treatment solution further includes a complexing agent. The complexing agent is configured to bind to corrosion product which has dissolved off of the wafer surface and into the solution. The complexing agent may be configured to prevent redeposition of the corrosion product.

In one specific embodiment, the complexing agent is selected from the group consisting of hydroxyethyl diphosphonic acid, oxalic acid dihydrate, phytic acid, and pyrophosphoric acid.

In one embodiment, the concentration of the complexing agent is approximately in the range of 0.05 g/L to 20 g/L. In another embodiment, the concentration of the complexing agent is approximately 1 g/L.

In one embodiment, the treatment solution further includes a pH adjusting agent. The pH adjusting agent may be configured to reduce the pH of the solution to approximately less than 3 during the application onto the wafer surface.

In one embodiment, the pH adjusting agent is selected from the group consisting of hypophosphorous acid, methane sulfonic acid, sulfuric acid, triflic acid, and trifluoroacetic acid.

In one embodiment, the concentration of the pH adjusting agent is approximately in the range of 0.01 g/L to 20 g/L. In another embodiment, the concentration of the pH adjusting agent is approximately 8 ml/L 50 w/w %.

In one embodiment, a treatment solution includes a surfactant and further includes a complexing agent configured to bind to corrosion product which has dissolved off of the wafer surface and into the solution, the complexing agent being selected from the group consisting of hydroxyethyl diphosphonic acid, oxalic acid dihydrate, phytic acid, and pyrophosphoric acid. And the treatment solution further includes a pH adjusting agent, the pH adjusting agent configured to reduce the pH of the solution to approximately less than 3 during the application onto the wafer surface, the pH adjusting agent selected from the group consisting of hypophosphorous acid, methane sulfonic acid, sulfuric acid, triflic acid, and trifluoroacetic acid.

In one embodiment, the solution does not significantly inhibit the functionality of a recirculated deposition solution used to generate the metallic capping layer in the case of cross-contamination with the deposition solution.

In one embodiment, the wafer surface includes regions of a dielectric material, the regions of the dielectric material having the corrosion product of the capping layer situated thereon prior to application of the solution.

In one embodiment, the dielectric material has a K value of approximately less than or equal to 3.0.

In one embodiment, the metallic capping layer consists of cobalt or a cobalt alloy.

It is to be understood that the invention is not limited in its application to the details of construction and to the arrangements of the components set forth in the following description. The invention is capable of other embodiments and of being practiced and carried out in various ways. In addition, it is to be understood that the phraseology and terminology employed herein are for the purpose of description and should not be regarded as limiting. Other aspects of the invention will become apparent from the following detailed description, taken in conjunction with the accompanying drawings, illustrating by way of example the principles of the invention.

BRIEF DESCRIPTION OF THE DRAWINGS

The invention will be understood by reference to the following description taken in conjunction with the accompanying drawings in which:

FIG. 2A illustrates a treatment solution applied on a wafer surface, in accordance with an embodiment of the present invention.

FIG. 2B illustrates a treatment solution applied on a wafer surface, in accordance with an embodiment of the present invention.

DETAILED DESCRIPTION

The present invention pertains to interconnect metallization that uses an electrically conductive metal with a cap and a dielectric forming a damascene metallization structure for electronic devices such as integrated circuits. More specifically, the present invention is directed toward cleaning solution formulations for cleaning substrates for electronic devices. For some applications, the interconnect metallization layers include a dielectric and a metal, such as copper.

Embodiments of the present invention will be discussed below primarily in the context of processing semiconductor wafers such as silicon wafers used for fabricating integrated circuits. The metallization layers for the integrated circuits include copper for metal lines formed into damascene and/or dual damascene dielectric structures. The copper metal lines have electrolessly deposited caps. Some preferred caps are multi-element alloys such as cobalt alloy, cobalt-tungsten alloy, cobalt-tungsten-phosphorous-boron alloy, cobalt-nickel alloy, and nickel alloy. Optionally, the dielectric is a low k dielectric material such as a carbon doped silicon oxide (SiOC:H). However, it is to be understood that embodiments in accordance with the present invention may be used for other semiconductor devices, metals other than copper, caps with metals other than nickel and/or cobalt, and wafers other than semiconductor wafers.

For some applications, cleaning solutions according to embodiments of the present invention can be used to clean substrates after deposition of the cap. The cleaning solutions may be capable of removing contaminants such as ions left on the dielectric surface between the capped copper interconnect structures. The removal of such contaminants may produce results such as improved leakage current properties, improved voltage breakdown properties, and improved time-dependent dielectric breakdown performance.

Additionally, cleaning solutions according to embodiments of the present invention may be used in conjunction with wet transfer systems, wherein a wafer is transferred or otherwise transitioned from one processing step to another while maintained in a wet state (i.e. with a solution such as the presently described cleaning solutions present on the surface of the wafer). In such wet transfer systems, the cleaning solution may act to reduce or prevent contamination of the wafer surface and other problems associated with dry transfer of a wafer, such as contamination by droplets, airborne particles, and the attendant complexities of drying and rewetting the wafer surface, etc. Additional details regarding wet transfer systems are provided with reference to U.S. provisional patent application No. 61/285,950, entitled "INTEGRATED TOOL SETS AND PROCESS TO KEEP SUBSTRATE SURFACE WET DURING PLAYING AND CLEAN IN FABRICATION OF ADVANCED NANO-ELECTRONIC DEVICES," filed on Dec. 11, 2009, the disclosure of which is herein incorporated by reference in its entirety.

Figure 1A:
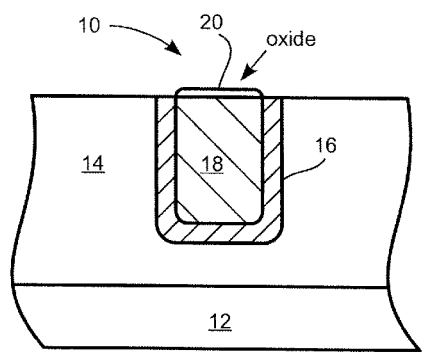
FIG. 1A illustrates a close-up view of a semiconductor interconnect after a CMP step, in accordance with an embodiment of the present invention.

With reference to FIG. 1A, a close up view of a semiconductor interconnect 10 after a CMP step is shown, in accordance with an embodiment of the present invention.

A semiconductor wafer 12 may be of a material such as silicon, gallium arsenide, diamond, etc. The semiconductor wafer 12 has been processed to form semiconductor elements, such as transistors, in and above it.

A dielectric layer 14, such as an ILD, has been deposited on the semiconductor wafer 12. The dielectric layer 14 is of dielectric materials such as silicon oxide ($SiO_x$), tetraethoxysilane (TEOS), borophosphosilicate (BPSG) glass, etc. with dielectric constants from about 4.2 to 3.9 or low dielectric constant dielectric materials such as fluorinated tetraethoxysilane (FTEOS), hydrogen silsesquioxane (HSQ), benzocyclobutene (BCB), carbon-doped silicon dioxide, etc. with dielectric constants below about 3.9. Ultra-low dielectric constant dielectric materials are dielectric materials having dielectric constants below about 2.5. Examples of such materials include commercially available Teflon, Teflon-AF, Teflon microemulsion, polimide nanofoams, silica aerogels, silica xerogels, and mesoporous silica.

The dielectric layer 14 has been processed to have a channel or via formed therein, which is lined with a barrier layer 16. The barrier layer 16 may be composed of materials such as tantalum (Ta), tantalum nitride (TaN), titanium (Ti), tungsten (W), alloys thereof, and compounds thereof.

The barrier layer 16 is filled with a conductor 18 such as copper (Cu), aluminum (Al), gold (Au), silver (Ag), alloys thereof, and compounds thereof.

Figure 1B:
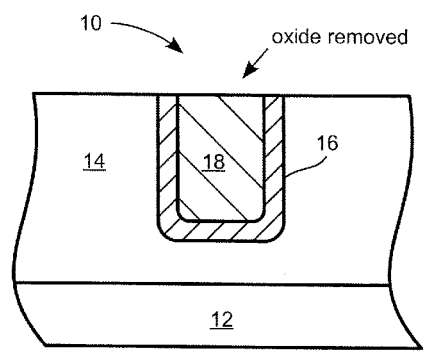
FIG. 1B illustrates a close-up view of a semiconductor interconnect after an oxide removal step, in accordance with an embodiment of the present invention.

With reference to FIG. 1B, a close-up view of the semiconductor interconnect 10 after an oxide removal step is shown, in accordance with an embodiment of the present invention. The oxide removal step removes the oxide layer 20 of FIG. 1A.

Figure 1C:
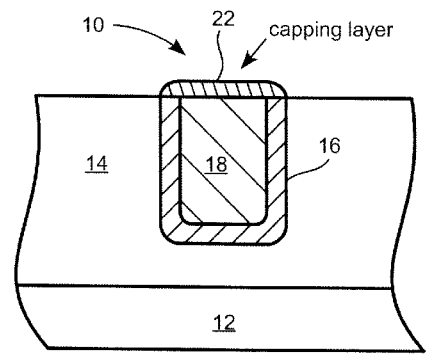
FIG. 1C illustrates a close-up view of a semiconductor interconnect after a capping step, in accordance with an embodiment of the present invention.

With reference to FIG. 1C, therein is shown a close up view of the semiconductor interconnect 10 after a capping step according to a first embodiment of the present invention.

A capping layer 22 is then deposited on the barrier layer 16 and the conductor 18. The capping layer 22 can be a metal or metal compound such as cobalt (Co) or cobalt tungsten phosphorous (CoWP), cobalt tungsten boron (CoWB), cobalt tungsten phosphorous boron (CoWPB), etc., deposited by electroless deposition.

With reference to FIG. 2A a treatment solution 30 is shown, in accordance with an embodiment of the present invention. The treatment solution 30 includes a surfactant 32 that also acts as a corrosion inhibitor, a complexing agent 34, and a pH adjuster 36. Optionally, for some embodiments of the present invention the cleaning solution is an aqueous solution. However, other embodiments of the present invention may be non-aqueous cleaning solutions wherein a non-aqueous liquid is used instead of water.

As shown, the treatment solution 30 is applied to the surface of a substrate 40. The exposed surface of the substrate 40 includes regions of a dielectric 14 and regions of a metallic capping layer 20. During and following prior processing steps (e.g. a rinse step with DI water following deposition of the metallic capping layer 22), corrosion of the capping layer 22 may occur. The resulting corrosion product 38 may consist of various oxides and hydroxylated metal ions which are adsorbed on the surface of the substrate 40.

For example, in an embodiment wherein the capping layer includes cobalt, the resulting corrosion products of cobalt may include various hydroxides and oxides such as $Co(OH)_2$, $Co(OH)_3$, $CoOOH$, $CoO$, $CO_2O_3$, $CO_3O_4$, etc.

In order to promote desorption of the corrosion product 38 from the surface of the substrate 40, generally, treatment solutions according to embodiments of the present invention have a pH of approximately less than or equal to 3. Optionally, the pH of the treatment solution may be less than or equal to 2 for some embodiments. Some embodiments of the present invention include the treatment solution having a pH of about 1.8 to 1.9. In certain embodiments, the pH may be approximately 1.85.

The low pH of the treatment solution promotes desorption of the corrosion product 38 from the surface of the substrate 40, due to the effects of the high concentration of hydrogen ions. First, the high concentration of hydrogen ions causes the surface of the substrate 40 to be positively charged. Second, the available hydrogen ions promote a dehydration reaction with hydroxylated metal ions, thus releasing the metal ions; and as the metal ions are positively charged, they are electrostatically repelled from the positively charged surface of the substrate 40.

However, the low pH of the treatment solution 30, while promoting desorption of corrosion product 38 from the substrate 40, also promotes further corrosion of the capping layer 22. Hence, it is desirable to inhibit the corrosion of the capping layer 22 caused by the acidity of the treatment solution 30.

Surfactant(s):

Therefore, as stated above, the treatment solution 30 includes a surfactant 32 which also acts as a corrosion inhibitor. Optionally the treatment solution 30 may contain more than one surfactant. The surfactant 32 reduces the surface tension of the treatment solution 30, thereby promoting adequate wetting of both the dielectric and capping regions of the substrate 40 when applied. By promoting wetting of the substrate 40, the surfactant 32 thus provides for even cleaning of the substrate surface, as well as protection of the substrate surface from droplets and airborne particles.

One of the functions of the surfactant 32 may be to substantially protect the capping layer 22 and inhibit the corrosion of the capping layer 22 in the treatment solution 30. For some applications, the treatment solutions according to embodiments of the present invention are configured so as to clean the substrate with negligible or substantially no reduction in the thickness of the capping layer 22. The one or more surfactants may be included in embodiments of the present invention for this purpose.

The surfactant 32 may be configured to selectively bind to the capping layer 22 at low pH. More specifically, the polar end of the surfactant 32 binds to the capping layer 22, while the hydrophobic end of the surfactant is oriented away from the capping layer 22. The surfactant 32 thus forms a protective layer 42 (as shown at FIG. 2B) on the capping layer 22, which inhibits the corrosion of the capping layer 22 due to the presence of the treatment solution 30 and its low pH, without affecting the dielectric regions of the substrate 40. Embodiments of the invention include the surfactant 32 being configured to form a self-assembled monolayer (SAM) on the capping layer 22, wherein the polar ends of the surfactant molecules are directed towards the capping layer 22 and the hydrophobic tails are directed away from the capping layer 22.

The surfactant 32 may be configured so as to remain bound to the capping layer 22 until the pH is raised to alkaline levels. Thus, during a subsequent rinse step with DI water (during which it is possible to further corrode the capping layer 22), the capping layer 22 remains protected by the surfactant layer 42. However, when an alkaline solution such as a deposition solution is applied to the surface of the substrate 40, then the surfactant layer 42 is disrupted and dissociates from the capping layer 22. In embodiments of the invention, the surfactant may be configured so as to be compatible with a deposition solution for the capping layer. In other words, when limited amounts of the surfactant contaminate the deposition solution, the functionality of the deposition solution is not significantly inhibited.

Numerous compounds are suitable for use as surfactants which also act as corrosion inhibitors in embodiments of the present invention. A list of surfactants for embodiments of the present invention includes, but is not limited to, anionic surfactants, cationic surfactants, nonionic surfactants, amphoteric surfactants, zwitterions and combinations thereof. Some of the surfactants for some embodiments of the present invention are surfactants that have sulfate or sulfonate head groups.

In some embodiments of the present invention, the surfactant preferably consists of an amphoteric surfactant having an acidic functional group. The amphoteric surfactant may include an acidic functional group for purposes of enhancing compatibility with an alkaline deposition solution for the capping layer, and for affecting the pH of the treatment solution. The acidic functional group may be configured so as to allow the protective layer formed by the surfactant on the capping layer to be disrupted when exposed to an alkaline deposition solution.

In certain embodiments of the invention, the surfactant may be a betaine, or a zwitterion of a substituted alkyl derivative of N,N-dimethyl glycine. In one embodiment, the surfactant is cocamidopropyl betaine. The surfactant may contain alkyl, fluoroalkyl, or partially fluorinated alkyl groups. Surfactants in accordance with embodiments of the invention may include an acidic functional group. The acidic functional group may be one of various acidic functional groups, such as carboxyl, phosphate, phosphite, sulfonate, etc. Treatment solutions according to some embodiments of the present invention include one or more surfactants present in amounts ranging from about 10 ppm to about 2000 ppm for the active component of the formulation for each surfactant. The molecular weight of the surfactant is not always known.

Generally, an effective amount of surfactant is provided in treatment solutions according to the present invention. In other words, the amount of surfactant in the treatment solution is selected so that the solution is effective in cleaning the substrate and providing satisfactory prevention of corrosion of the cap. For some embodiments of the present invention the treatment solutions contain one or more surfactants with each of the surfactants present in the treatment solution in a concentration range of about 10 parts per million (ppm) to about 2000 ppm. As an option for some cleaning solutions according to embodiments of the present invention, the surfactant is present at a concentration between about 300 ppm and about 700 ppm and all sub-ranges subsumed therein.

In accordance with embodiments of the invention, the configuration and concentration of the surfactant is selected so as to provide the desired pH level for the treatment solution. The pH level may be adjusted by the presence of the surfactant so as to promote desorption of corrosion product from the surface of the wafer.

Complexing Agent:

Treatment solutions according to embodiments of the present invention may optionally also include a complexing agent 34. The complexing agent 34 according to some embodiments of the present invention includes functional groups so as to be capable of forming complexes with metal ions. By effectively forming complexes with metal ions which have desorbed from the surface, the complexing agent 34 acts to stabilize the metal ions in solution. This serves to prevent the metal ions from redepositing onto the wafer surface. Such redeposition may be prone to occurring during subsequent steps (such as a DI water rinse step) when the pH may increase and cause hydroxylation and oxidation of the metal ions and consequent redeposition of corrosion product on the surface of the wafer.

Thus it is contemplated that embodiments of the invention include the complexing agent 34 being configured so as to effectively bind to metal ions across a broad range of pH values, including pH values of both less than and greater than 3. As illustrated at FIG. 2B, the corrosion product 38 is desorbed from the surface of the substrate 40, and subsequently forms a complex 44 with the complexing agent 34.

The complexing agent 34 may also have one or more functional groups so as to be capable of adjusting the pH of the cleaning solution. More specifically, the complexing agent is also capable of contributing to and affecting the pH of the solution so as to maintain the pH of the cleaning solution at or below about 3.

Complexing agents for cleaning solutions according to embodiments of the present invention can be found in "Stability Constants of Metal-Ion Complexes: Inorganic Ligands, Organic Ligands; and Supplement," by Lars Gunnar Sillen and Arthur E. Martell, 2 Volume Set (Special Publication No. 17 and Supplement No. 1), 1972, which is incorporated herein in its entirety by this reference. A list of complexing agents capable of affecting the pH of the solution includes, but is not limited to, phytic acid, oxalic acid (CAS # [6153-56-6]), pyrophosphoric acid, hydroxyethylidene diphosphonic acid (CAS # [2809-21-4] also known as etidronic acid, ethane-1-hydroxy-1,1-diphosphonic acid, or HEDPA), phytic acid, malonic acid, maleic acid, and mixtures thereof.

Generally, cleaning solutions according to embodiments of the present invention contain an effective amount of complexing agent capable of functioning to form complexes with the metal ions removed from the surface of the substrate and to contribute to the maintenance of the pH at the desired level (so as to facilitate the removal of metal ions from the surface of the substrate). The specific amount required depends upon the properties of the complexing agent.

For some embodiments of the present invention the concentration of complexing agent ranges from about 0.05 g/L to 20 g/L. In other embodiments the concentration of complexing agent may range from approximately 0.5 g/L to 2 g/L, and all subranges included therein.

pH Adjuster(s):

Treatment solutions in accordance with embodiments of the invention may optionally also include a pH adjuster 36 (or multiple pH adjusters). The pH adjusters in cleaning solutions according to some embodiments of the present invention have functional groups so as to be capable of maintaining the pH of the cleaning solution at a desired level. As discussed, in some embodiments, the desired pH level may be less than about 3 or 2. For specific embodiments of the present invention, this may mean that the pH adjuster 36 has functional groups for producing an acidic cleaning solution. Optionally, the pH adjuster may also have capabilities as a complexing agent.

A list of pH adjusters for embodiments of the present invention includes, but is not limited to, sulphuric acid, sulfonic acids such as but not limited to methanesulfonic acid, benzene sulfonic acid, and triflic acid, hypophosphorous acid, oxalic acid, halogenated carboxylic acids such as but not limited to trifluoroacetic acid, triflic acid, acetylenedicarboxylic acid, squaric acid, dihydroxyfumaric acid, maleic acid, and mixtures thereof. As an option, the pH adjustor may include one or more acids having $pK_a$ about equal to or less than 2, where $pK_a$ is the negative logarithm of the acid ionization constant, $K_a$, and the one or more acids being capable so as to adjust the cleaning solution to the desired acidic pH. Alternatively, the pH adjustor may include one or more acids having $pK_a$ equal to or less than 1.5 and the one or more acids being capable so as to adjust the cleaning solution to the desired acidic pH.

In certain embodiments of the invention, the pH adjuster is configured so as to be compatible with a deposition solution. In other words, the pH adjuster is selected such that in the case of contamination of the deposition solution by the treatment solution, the functionality of the deposition solution is not significantly inhibited.

Generally, cleaning solutions according to embodiments of the present invention contain an effective amount of pH adjuster so as to maintain the pH at the desired level. The specific amount required depends upon the properties of the pH adjuster and the desired pH level. For some embodiments of the present invention, the amount of pH adjuster is between about 0.01 g/L and 20 g/L. In other embodiments of the present invention, the concentration of pH adjuster ranges from approximately 3 g/L to 5 g/L.

The inclusion of the pH adjuster may be a cost-effective way of adjusting the pH level of the treatment solution to the desired level. For example, in various embodiments, either or both of the surfactant or the complexing agent may function as agents which lower the pH of the solution. However, it may be cost-prohibitive to concentrate either of the surfactant or the complexing agent in order to achieve the desired low pH. Therefore, a relatively inexpensive pH adjuster may be chosen so as to adjust the pH to the desired level at lower cost than would be possible with a solution consisting of only the surfactant and the complexing agent.

Examples of Treatment Solution Formulations:

Treatment solutions according to embodiments of the present invention may have any one of numerous specific formulations.

In one embodiment, the treatment solution includes one or more surfactants. The surfactant is configured to promote wetting of the wafer surface and to protect the capping layer from corrosion, while simultaneously producing a low pH in order to effect desorption of corrosion product from the surface of the wafer. The specific configuration and concentration of the surfactant may be chosen so as to provide sufficiently low pH as well as adequate inhibition of corrosion of the capping layer. Additionally, the surfactant may be configured so as to be compatible with a deposition solution for the capping layer, in the case of contamination of the deposition solution with the treatment solution.

In one embodiment, the treatment solution includes both a surfactant and a pH adjuster. The surfactant promotes wetting of the wafer surface and inhibits corrosion of the capping layer, but by itself does not produce the desired pH level for the treatment solution. The pH adjuster is configured to adjust the pH of the solution to the desired level (e.g. less than 3.0). The configuration and specific concentrations of the surfactant and the pH adjuster may be chosen so as to provide adequate wetting, sufficient inhibition of corrosion of the capping layer, and sufficiently low pH. Additionally, the surfactant and the pH adjuster may be configured so as to be compatible with a deposition solution for the capping layer, in the case of contamination of the deposition solution with the treatment solution.

In one embodiment, the treatment solution includes both a surfactant and a complexing agent. The surfactant is configured to promote wetting of the wafer surface and inhibit corrosion of the capping layer. The complexing agent is configured to bind to metal ions in solution so as to prevent their deposition (or redeposition) onto the wafer surface. Either or both of the surfactant and the complexing agent may also be configured so as to produce the desired pH level for the treatment solution. The specific configuration and concentrations of the surfactant and complexing agent may be chosen so as to provide adequate wetting, adequate inhibition of corrosion of the capping layer, sufficient prevention of redeposition of corrosion product, and the desired pH level. Additionally, the surfactant and complexing agent may be selected so as to be compatible with a deposition solution for the capping layer, in the case of contamination of the deposition solution with the treatment solution.

In one embodiment, the treatment solution includes a surfactant, a complexing agent, and a pH adjuster. The surfactant is configured to promote wetting of the wafer surface and to inhibit corrosion of the capping layer. The complexing agent is configured to bind to metal ions in the treatment solution. The pH adjuster is configured to adjust the pH of the treatment solution to the desired level. Either of the surfactant or the complexing agent, or both, may also be configured to affect the pH level.

The specific configurations and concentrations of the surfactant, the complexing agent, and the pH adjuster may be chosen so as to provide adequate wetting, adequate inhibition of corrosion of the capping layer, sufficient prevention of redeposition of corrosion product onto the wafer surface, and the desired pH level. Additionally, the surfactant, complexing agent, and the pH adjuster may be selected so as to be compatible with a deposition solution for the capping layer, in the case of contamination of the deposition solution with the treatment solution.

Figure 3A:
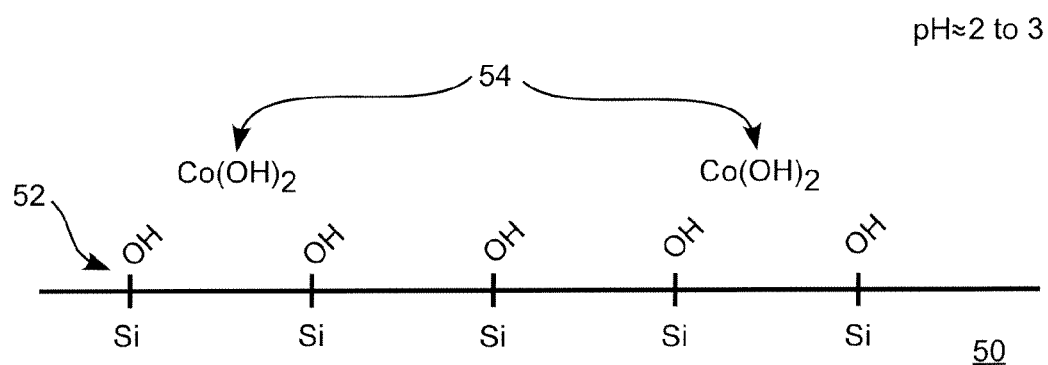
FIGS. 3A and 3B illustrate a mechanism for desorption of corrosion product from the surface of a substrate is illustrated, in accordance with an embodiment of the invention.
Figure 3B:
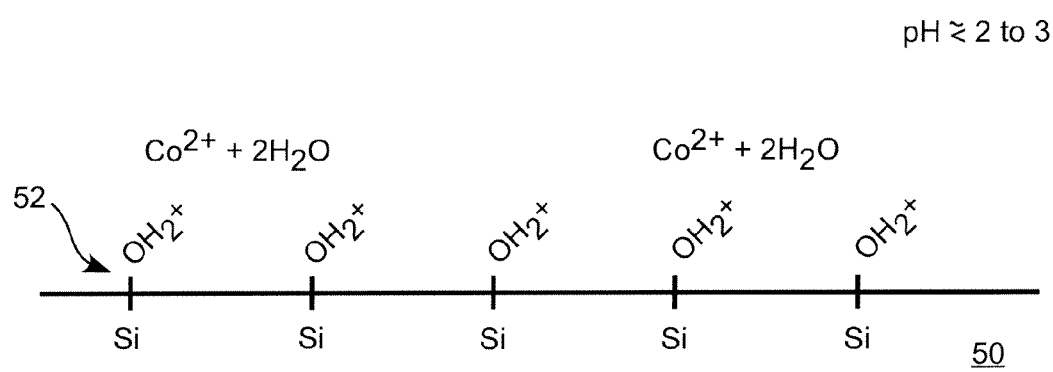

With reference to FIGS. 3A and 3B, a mechanism for desorption of corrosion product from the surface of a substrate is illustrated, in accordance with an embodiment of the invention. As shown at FIG. 3A, a substrate surface 50 includes a dielectric such as silicon dioxide. In various embodiments, other dielectrics and surface materials may compose the substrate surface 50. Silicon dioxide, as one example, has a point of zero charge of approximately pH 2 to 3. Thus, at a pH of approximately 2 to 3, the substrate surface 50 is neutrally charged. As shown in the illustrated example wherein silicon dioxide is included in the substrate surface, the exposed hydroxyl groups 52 of the silicon dioxide surface exhibit a net zero charge.

Additionally, metallic corrosion product, such as metal hydroxides which precipitate from solution, may be present on the substrate surface 50. Following deposition of a capping layer, there may subsequent steps such as a rinse step with DI water to halt the deposition process and to remove the deposition solution. However, such steps may also promote corrosion of the capping layer, resulting in the formation of corrosion product. In the example shown at FIG. 3A, the corrosion product 54 includes $Co(OH)_2$ which has resulted from corrosion of a cobalt-containing capping layer. The cobalt ions form aqua ions in aqueous solution and undergo a hydrolysis reaction to form the cobalt hydroxide which precipitates onto the substrate surface 50. In various embodiments of the invention, the corrosion product may include various metal hydroxides and complexes which result from corrosion of metallic surfaces. The corrosion product 54 is adsorbed on the substrate surface 50.

However, when the pH is lowered to a sufficient extent (e.g. approximately less than 2), the substrate surface 50 becomes positively charged due to protonation of the exposed hydroxyl groups 52, as shown at FIG. 3B. Additionally, hydroxide corrosion product undergoes a dehydration reaction which is driven by the low pH, according to the following general reaction:

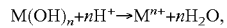

where M is a metal. In the specific case of cobalt hydroxide, the reaction is as follows:

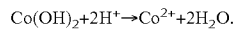

The released metal ion ($Co^{2+}$ in the illustrated example) is electrostatically repelled from the positively charged substrate surface. Thus, the low pH of approximately less than 2 facilitates the desorption of corrosion product 54 from the substrate surface 50.

Figure 4:
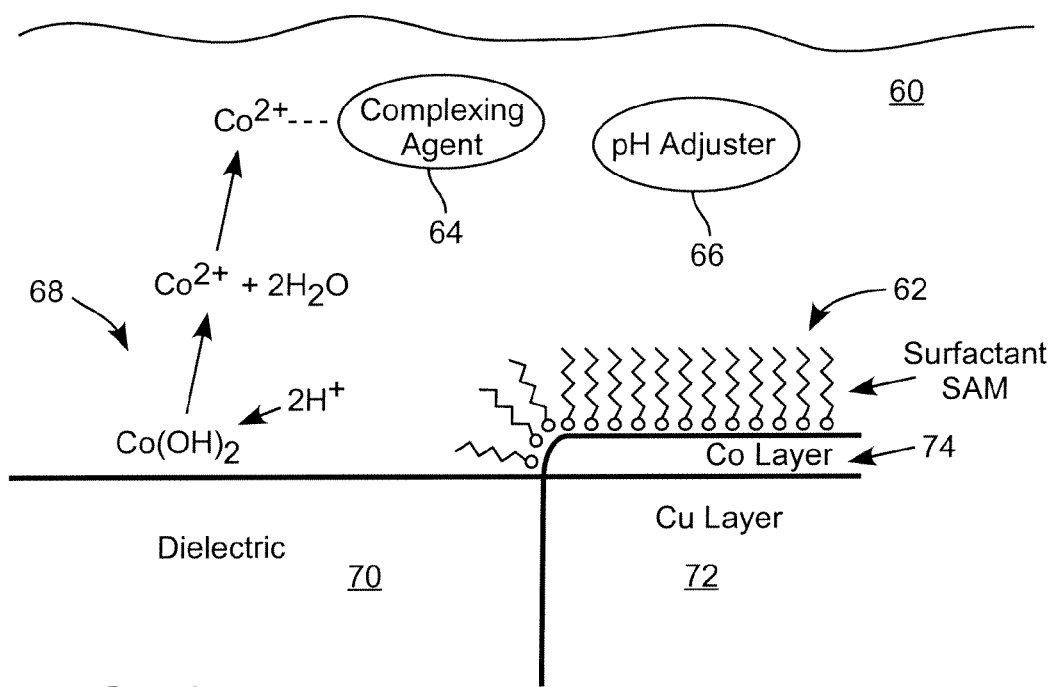
FIG. 4 illustrates a treatment solution for cleaning corrosion product from the surface of a substrate, in accordance with an embodiment of the invention.

With reference to FIG. 4, a treatment solution 60 is shown for cleaning corrosion product from the surface of a substrate, in accordance with an embodiment of the invention. The surface of the substrate includes regions of a dielectric 70 and a capping layer 74. In some embodiments, the capping layer 74 consists of cobalt or a cobalt alloy, and protects a conductive layer, such as a copper layer 72 from oxidation and electromigration. In one embodiment, the treatment solution 60 includes a surfactant 62, a complexing agent 64, and a pH adjuster 66.

The surfactant 62 promotes wetting to facilitate coverage of the substrate surface by the treatment solution 60. In one embodiment, the surfactant 62 is configured to selectively bind to the capping layer 74, and form a self-assembled monolayer so as to protect the capping layer 74 from corrosion.

In one embodiment, the treatment solution is configured to have a pH of approximately less than 2 to 3. Such a low pH promotes desorption of corrosion product (such as metal hydroxide) which is adsorbed on the surface of the dielectric 70. The desorption may occur via a dehydration reaction as illustrated at reference numeral 68. The low pH of the treatment solution would also promote further corrosion of the capping layer 74; however, the surfactant SAM on the capping layer acts to inhibit such corrosion as would otherwise occur due to the low pH of the treatment solution.

The desorption of the corrosion product from the substrate surface causes metal ions to be released into the treatment solution. The complexing agent 64 binds to the metal ions, forming complexes which stabilize the metal ions in the treatment solution and inhibit their reprecipitation as hydroxides onto the surface of the substrate, as would otherwise likely occur when the pH is adjusted upwards in subsequent steps (e.g. a rinse step or subsequent processing step with a higher pH liquid such as DI water). The complexing agent is configured to bind to metal ions at low pH, such as a pH of approximately less than 2 to 3. Additionally, the complexing agent may be an acidic compound, thereby affecting the overall pH of the treatment solution.

Thus, by way of example, in the case of corrosion product of a cobalt capping layer, the reaction may proceed according to the following formula:

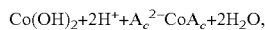
$$Co(OH)_2 + 2H^+ + A_c^{2-} \rightarrow CoA_c + 2H_2O,$$

where $A_c$ is a complexing agent configured to bind to cobalt ions.

The treatment solution 60 may also include an optional pH adjuster 66. The pH adjuster 66 is provided so as to adjust the pH of the treatment solution to the desired level. Though the complexing agent 64 may be an acid, in some embodiments it may be undesirable to concentrate the complexing agent 64 to provide the desired pH level due to efficiency and cost considerations. Therefore, it may be advantageous to utilize a pH adjuster 66 in order to more efficiently achieve the desired pH level for promoting desorption of corrosion product from the substrate surface.

In some embodiments, the treatment solution 60 does not include a pH adjuster. Rather, the complexing agent or surfactant is configured as an acidic compound and concentrated to an appropriate concentration so as to provide the desired pH level.

The treatment solution 60 in accordance with embodiments of the invention may be configured so as to be compatible with a deposition solution for the capping layer in the case of contamination of the deposition solution with the treatment solution. Such contamination may be of concern when the application of the deposition and the cleaning solution take place in the same device, and the deposition solution is recirculated. Thus, it may be desirable to configure the treatment solution so that the functionality of the deposition solution is not substantially inhibited by inadvertent contamination with the treatment solution.

As such, each of the components of the treatment solution may be configured so as to be compatible with the deposition solution. In other words, the surfactant, the complexing agent, and the pH adjuster may be configured so as to not substantially inhibit the functionality of the deposition solution.

In some embodiments, the surfactant is configured so as to selectively bind to the metallic capping layer at low pH. As indicated previously, the surfactant forms a surfactant SAM on the capping layer which may remain on the capping layer even at neutral pH. However, the surfactant may be configured so that the surfactant SAM is disrupted at alkaline pH. Thus, the deposition solution may be configured to have an alkaline pH, and as such causes disruption of the surfactant SAM when applied to the substrate surface. In this manner, the surfactant does not hinder the activity of the deposition solution.

In some embodiments, the complexing agent is configured so as to bind to metallic ions in solution only at low pH. Thus, when the complexing agent of the treatment solution contaminates the deposition solution, the complexing agent is rendered inactive by the alkaline pH of the deposition solution. As such, the complexing agent does not interfere with metallic ions present in the deposition solution, and so does not substantially inhibit their functionality in the deposition solution.

In some embodiments, the pH adjuster is configured so as to not substantially interfere with the functionality of the deposition solution. In some embodiments, this may be accomplished by selecting the pH adjuster to be an acid which is already present in the deposition solution.

Figure 5A:
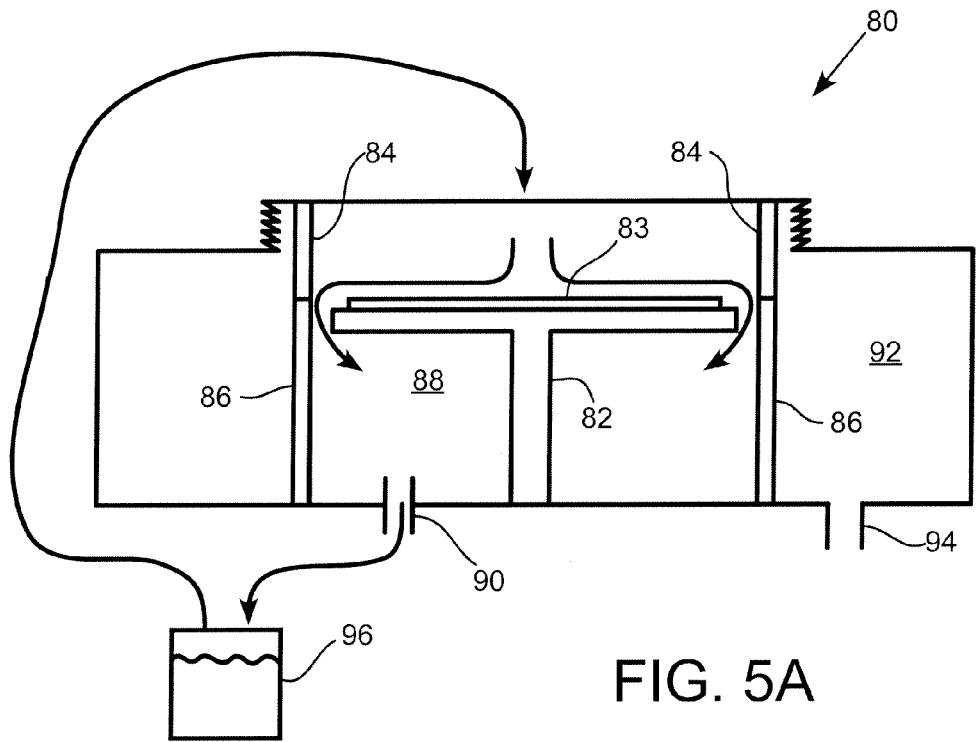
FIG. 5A illustrates a cross-sectional view of a processing chamber during a deposition process, in accordance with an embodiment of the present invention.
Figure 5B:
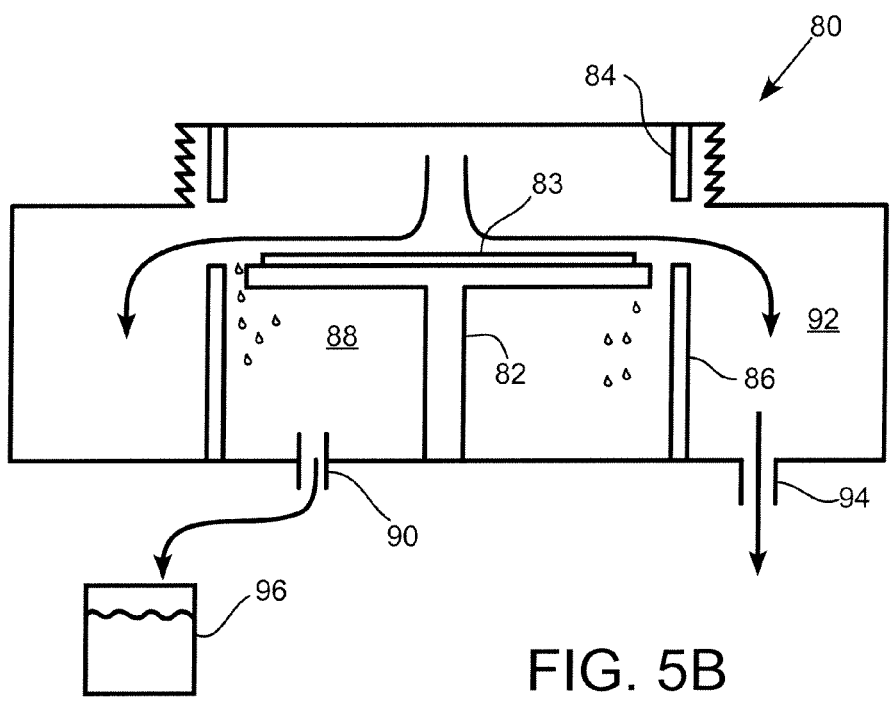
FIG. 5B illustrates a cross-sectional view of a processing chamber during a cleaning process, in accordance with an embodiment of the present invention.

With reference to FIGS. 5A and 5B, a cross sectional view of a processing chamber 80 is shown in different modes of operation. FIG. 5A illustrates the wafer processing chamber 80 during a deposition process. The processing chamber 80 includes a wafer support 82 for holding a wafer 83, the wafer support 82 being configured to rotate the wafer 83 as various processing solutions are applied to the surface of the wafer 83. The processing chamber 80 also includes an upper divider 84 and a lower divider 86. The upper divider 84 is movable so as to form a seal with the lower divider 86. FIG. 5A illustrates the processing chamber 80 in a "closed" position wherein the upper divider 84 is sealed against the lower divider 86. The upper divider 84 and the lower divider 86 together define an inner chamber 88 and an outer chamber 92. The inner chamber 88 contains the wafer support 82 and the wafer 83.

FIG. 5A illustrates the processing chamber 80 during a deposition process, wherein the processing chamber 80 is in a closed position, and a deposition solution is being applied to the surface of the wafer 83. As the wafer 83 is rotated by the wafer support 82, the deposition solution flows off the edges of the wafer 83. Because the upper divider 84 and lower divider 86 are sealed together, the deposition solution stays within the inner chamber 88, and flows downward, and exits the inner chamber via inner chamber drain 90. The deposition solution flows to a deposition storage 96, from which the deposition solution is recirculated back into the wafer processing chamber 80.

FIG. 5B illustrates the processing chamber 80 during a cleaning process, wherein the processing chamber 80 is in an open position, such that the upper divider 84 is raised and separated from the lower divider 86. A cleaning solution is being applied to the surface of the wafer 83. As the wafer 83 is rotated by the wafer support 82, the majority of the cleaning solution flows off of the edges of the wafer 83 and into the outer chamber 92, and exits the outer chamber 92 via outer chamber drain 94. However, some of the cleaning solution may fall within the inner chamber 88, and therefore contaminate the deposition solution as it is recirculated. For this reason, it is desirable to formulate a cleaning solution in accordance with embodiments of the present invention, such that the cleaning solution is compatible with the deposition solution in the event of such contamination.

Figure 6:
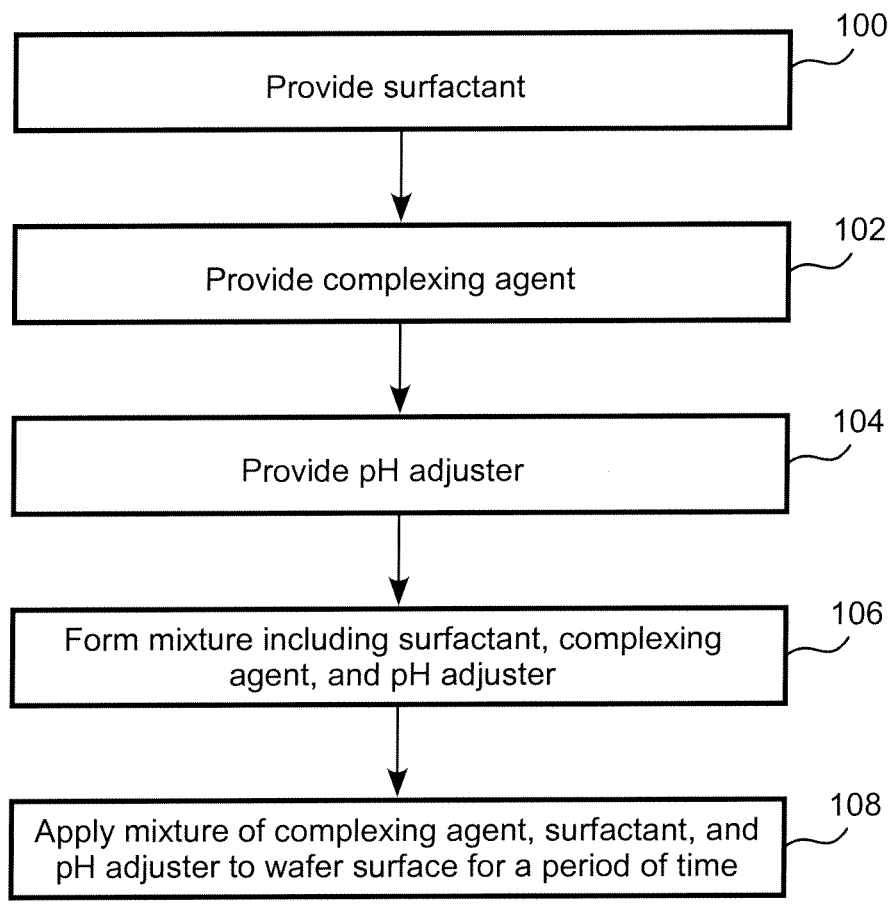
FIG. 6 illustrates an example of a pattern for aiding in detection of the outer frame of a display, in accordance with an embodiment of the invention.

With reference to FIG. 6, a method for treating a surface of a substrate is shown, in accordance with an embodiment of the invention. At method operation 100, a surfactant is provided. The surfactant may be configured to enhance wetting of a substrate, as well as inhibit corrosion of a capping layer. In one embodiment, the surfactant is an amphoteric surfactant.

At method operation 102, a complexing agent is provided. The complexing agent may be configured to bind to corrosion product of the capping layer which is released from dielectric regions of the surface of the substrate.

At method operation 104, a pH adjuster is provided. The pH adjuster is configured to adjust the pH of a mixture of the surfactant, the complexing agent, and the pH adjuster, to a desired level. The desired level may be that level of pH at which corrosion product is desorbed from the surface of the substrate.

At method operation 106, the mixture including the surfactant, the complexing agent, and the pH adjuster is formed.

At method operation 108, the mixture is applied to the surface of the substrate/wafer for a period of time, so as to accomplish removal of corrosion product from the substrate surface.

As an option, the process of cleaning substrates using cleaning solutions according to embodiments of the present invention can be performed using a brush to apply the cleaning solution to the substrate. Alternatively, the process can be performed by applying the cleaning solution to the substrate by methods such as dipping or immersing the substrate into the cleaning solution, such as rinsing the substrate with the cleaning solution, such as spraying the cleaning solution onto the substrate, and such as applying the cleaning solution using a proximity head.

The cleaning efficiency of cleaning solutions according to embodiments of the present invention can be enhanced further by using processes such as applying ultrasonic or megasonic energy to the substrate during cleaning and/or by using elevated temperatures during the cleaning. For some applications, the cleaning solutions are used at temperatures in the range from about 5° C. to about 90° C. Cleaning solutions according to embodiments of the present invention can be applied to clean substrates after deposition of a cap layer.

In the foregoing specification, the invention has been described with reference to specific embodiments. However, one of ordinary skill in the art appreciates that various modifications and changes can be made without departing from the scope of the present invention as set forth in the claims below. Accordingly, the specification is to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A solution for application onto a wafer surface, the wafer surface including a metallic capping layer, the solution effective for rinsing corrosion product of the metallic capping layer from the wafer surface while reducing corrosion of the metallic capping layer, the solution comprising,
a surfactant, the surfactant configured to enhance wetting of the wafer surface and to inhibit further corrosion of the capping layer, the concentration of the surfactant in the solution being approximately in the range of 10 ppm to 2000 ppm;
wherein the solution is maintained at a pH of approximately 1.8 to 1.9 during the application onto the wafer surface;
wherein the surfactant is an amphoteric surfactant;
further comprising oxalic acid dihydrate as a complexing agent configured to bind to corrosion product which has dissolved off of the wafer surface and into the solution; and
further comprising hypophosphorous acid as a pH adjusting agent configured to reduce the pH of the solution to approximately 1.8 to 1.9 during the application onto the wafer surface.

2. The solution of claim 1, wherein the surfactant forms a self-assembled monolayer on the metallic capping layer.

3. The solution of claim 1, wherein the concentration of the surfactant in the solution is approximately in the range of 300 ppm to 700 ppm.

4. The solution of claim 1, wherein the complexing agent prevents redeposition of the corrosion product.

5. The solution of claim 1, wherein the concentration of the complexing agent is approximately in the range of 0.05 g/L to 20 g/L.

6. The solution of claim 1, wherein the concentration of the complexing agent is approximately 1 g/L.

7. The solution of claim 1, wherein the concentration of the pH adjusting agent is approximately in the range of 0.01 g/L to 20 g/L.

8. The solution of claim 1, wherein the concentration of the pH adjusting agent is approximately 8 ml/L 50 w/w %.

9. The solution of claim 1, wherein the solution does not significantly inhibit the functionality of a recirculated deposition solution used to generate the metallic capping layer in the case of cross-contamination with the deposition solution.

10. The solution of claim 1, wherein the wafer surface includes regions of a dielectric material, the regions of the dielectric material having the corrosion product of the capping layer situated thereon prior to application of the solution.

11. The solution of claim 10, wherein the dielectric material has a K value of approximately less than or equal to 3.0.

12. The solution of claim 1, wherein the metallic capping layer consists of cobalt or a cobalt alloy.

* * * * *